United States Patent
Li et al.

(10) Patent No.: US 11,508,882 B2
(45) Date of Patent: Nov. 22, 2022

(54) QUANTUM DOT LED, MANUFACTURING METHOD THEREOF AND DISPLAY DEVICE

(71) Applicant: HISENSE VISUAL TECHNOLOGY CO., LTD., Qingdao (CN)

(72) Inventors: Fulin Li, Qingdao (CN); Zhicheng Song, Qingdao (CN)

(73) Assignee: Hisense Visual Technology Co., Ltd., Qingdao (CN)

(*) Notice: Subject to any disclaimer, the term of this patent is extended or adjusted under 35 U.S.C. 154(b) by 23 days.

(21) Appl. No.: 16/673,830

(22) Filed: Nov. 4, 2019

(65) Prior Publication Data

US 2020/0075817 A1 Mar. 5, 2020

Related U.S. Application Data

(63) Continuation of application No. PCT/CN2018/090063, filed on Jun. 6, 2018.

(30) Foreign Application Priority Data

Nov. 7, 2017 (CN) .......................... 201711081559.1
Dec. 8, 2017 (CN) .......................... 201711297954.3

(51) Int. Cl.
*H01L 33/50* (2010.01)
*H01L 25/075* (2006.01)
(Continued)

(52) U.S. Cl.
CPC ........ *H01L 33/504* (2013.01); *H01L 25/0753* (2013.01); *H01L 33/486* (2013.01);
(Continued)

(58) Field of Classification Search
CPC ..... H01L 31/035218; H01L 31/035209; H01L 31/035227; H01L 31/035236
See application file for complete search history.

(56) References Cited

U.S. PATENT DOCUMENTS 10,158,054 B1 * 12/2018 Lin .................. H01L 33/56
2010/0309439 A1 * 12/2010 Bi .................. H04N 9/3161
353/30
(Continued)

FOREIGN PATENT DOCUMENTS

CN 1710724 A 12/2005
CN 102257646 A 11/2011
(Continued)

OTHER PUBLICATIONS

The International Search Report of corresponding International application No. PCT/CN2018/090063, dated Aug. 31, 2018.
(Continued)

*Primary Examiner* — Julio J Maldonado
*Assistant Examiner* — Mohammad A Rahman
(74) *Attorney, Agent, or Firm* — Crowell & Moring LLP

(57) ABSTRACT

Disclosed in the present application are a quantum dot LED, a manufacturing method thereof, and a display device, belonging to the technical field of LED light sources. The quantum dot LED includes an LED support, an LED chip, a filling layer, and a quantum dot layer, where the LED support comprises a chamber; the LED chip is arranged on a bottom surface of the chamber; the filling layer covers the bottom surface of the chamber and the LED chip, and is engaged with walls of the chamber; and the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets $h \geq 0.03$ mm.

15 Claims, 5 Drawing Sheets

(51) Int. Cl.
*H01L 33/48* (2010.01)
*H01L 33/56* (2010.01)

(52) U.S. Cl.
CPC ........ *H01L 33/56* (2013.01); *H01L 2933/005* (2013.01); *H01L 2933/0041* (2013.01); *H01L 2933/0091* (2013.01)

(56) References Cited

U.S. PATENT DOCUMENTS

| | | | | |
|---|---|---|---|---|
| 2012/0038892 | A1* | 2/2012 | Kurtz | H04N 9/3105 353/121 |
| 2015/0314276 | A1 | 11/2015 | Teng et al. | |
| 2016/0104827 | A1* | 4/2016 | Hong | H01L 33/504 349/71 |
| 2017/0068132 | A1* | 3/2017 | Li | G02F 1/133605 |
| 2017/0125650 | A1* | 5/2017 | Pickett | C09K 11/02 |
| 2018/0003356 | A1* | 1/2018 | Muster | F21S 41/14 |
| 2018/0275461 | A1* | 9/2018 | Park | G02F 1/133514 |
| 2019/0094623 | A1* | 3/2019 | Chang | G02F 1/133611 |

FOREIGN PATENT DOCUMENTS

| | | | |
|---|---|---|---|
| CN | 103456865 A | 12/2013 | |
| CN | 106058015 * | 6/2016 | ............ H01L 33/50 |
| CN | 205452347 U | 8/2016 | |
| CN | 106058015 A | 10/2016 | |
| CN | 106098906 A | 11/2016 | |
| CN | 106299075 A | 1/2017 | |
| CN | 106653985 A | 5/2017 | |
| CN | 107394028 A | 11/2017 | |
| CN | 107507901 A | 12/2017 | |
| CN | 107706289 A | 2/2018 | |
| CN | 108110120 A | 6/2018 | |
| WO | 2016/139954 A1 | 9/2016 | |

OTHER PUBLICATIONS

The Chinese First Examination Report of corresponding Chinese application No. 201711081559.1, dated Nov. 30, 2018.
The Chinese First Examination Report of corresponding Chinese application No. 201711297954.3, dated Feb. 27, 2019.

* cited by examiner

US 11,508,882 B2

QUANTUM DOT LED, MANUFACTURING METHOD THEREOF AND DISPLAY DEVICE

CROSS-REFERENCE TO RELATED APPLICATIONS

This application is a continuation of the International Application No. PCT/CN2018/090063, filed on Jun. 6, 2018, which claims priority to Chinese Patent Application No. 201711081559.1, filed on Nov. 7, 2017 and to Chinese Patent Application No. 201711297954.3, filed on Dec. 8, 2017, and the content of the three is hereby incorporated by reference in their entireties.

TECHNICAL FIELD

The present application relates to the field of display technologies and, in particular, to a quantum dot LED, a manufacturing method thereof and a display device.

BACKGROUND

An LED (Light-emitting diode) is a new type of solid-state light source with advantages such as high brightness, high luminous efficiency and long operating life. Among them, the white LED is gradually attracting people's attention as a new generation illumination source. Currently, in the field of display technologies, a quantum dot LED is applied to achieve backlighting with high color gamut, that is, a blue light LED is used to excite a quantum dot material to produce white light, and the color gamut can reach 100% of the color gamut specified in NTSC (National Television Standards Committee) or more.

Quantum dot materials may fail to work due to a high temperature and water and oxygen in the air during the application of such quantum dot LED, and the quantum dot materials need to be packaged. In the chip packaging technology, quantum dot materials are directly placed on an LED chip. It saves more quantum dot material by coating the quantum dot material on an entire light-emitting surface, compared to using a quantum dot film.

SUMMARY

In a first aspect, some embodiments of the present application provides a quantum dot LED, including an LED support, an LED chip, a filling layer, and a quantum dot layer, where:

the LED support comprises a chamber;

the LED chip is arranged on a bottom surface of the chamber;

the filling layer covers the bottom surface of the chamber and the LED chip, and is engaged with walls of the chamber; and the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets h≥0.03 mm.

In a second aspect, some embodiments of the present application further provide a manufacturing method of a quantum dot LED, including steps of:

controlling a mold in such a way that a bottom of an LED support is formed into a flat plate, surrounding edges of which extend upwardly to form a chamber having a hollow cavity;

soldering and retaining an LED chip to the bottom of the LED support;

covering the filling layer on the LED chip and a bottom surface of the LED support by a dispensing process, where the filling layer is engaged with walls of the chamber;

baking the filling layer to cure it;

providing a quantum dot material on a surface of the filling layer away from the bottom surface of the chamber by a dispensing process, forming a quantum dot layer, and a shortest distance h between the LED chip and the quantum dot layer satisfying h≥0.03 mm; and baking the quantum dot layer to cure it.

In a third aspect, some embodiments of the present application further provides a display device, including a quantum dot LED that includes an LED support, an LED chip, a filling layer, and a quantum dot layer, where:

the LED support comprises a chamber;

the LED chip is arranged on a bottom surface of the chamber;

the filling layer covers the bottom surface of the chamber and the LED chip, and is engaged with walls of the chamber; and the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets h≥0.03 mm.

BRIEF DESCRIPTION OF DRAWING(S)

In order to illustrate embodiments of the present application more clearly, accompanying drawings used for description of the embodiments will be briefly described. Obviously, the described drawings are merely some embodiments of present application. For persons of ordinary skill in the art, other drawings may be obtained based on these drawings without any creative effort.

DESCRIPTION OF EMBODIMENTS

In order to describe the embodiments and advantages of the present application more clearly, the embodiments of the present application will be further described in detail below with reference to the accompanying drawings. Unless otherwise defined, all technical terms used in the embodiments of the present application have the same meaning as those commonly understood by those skilled in the art.

In the related art, since the luminous intensity distribution of the LED chip presents Lambertian distribution, the smaller the light emitting angle, the higher the optical power per unit area, that is, the quantum dot material right above the LED chip is more susceptible to irradiation from blue light of high intensity, so that the quantum dot material will be irradiated by the blue light having power up to 60 W/cm2~100 W/cm2 (Watt/square centimeter). However, the quantum dot material generally has a tolerable power limit of 5 W/cm2 for the blue light, and recommended use is below 2 W/cm2 normally, that is, if the quantum dot material is out of the tolerable range limit of the optical power, quantum dots right above the LED chip will fail to work. Moreover, if the luminous intensity far from the LED chip is low, it is undesirable for displaying a high color gamut of the quantum dot LED. Therefore, there is a need to improve the efficiency of the LED chip and reliability of the quantum dot LED while making sure the quantum dot materials do not fail to work during use and the displaying of the quantum dot LED is in high color gamut.

Figure 1:
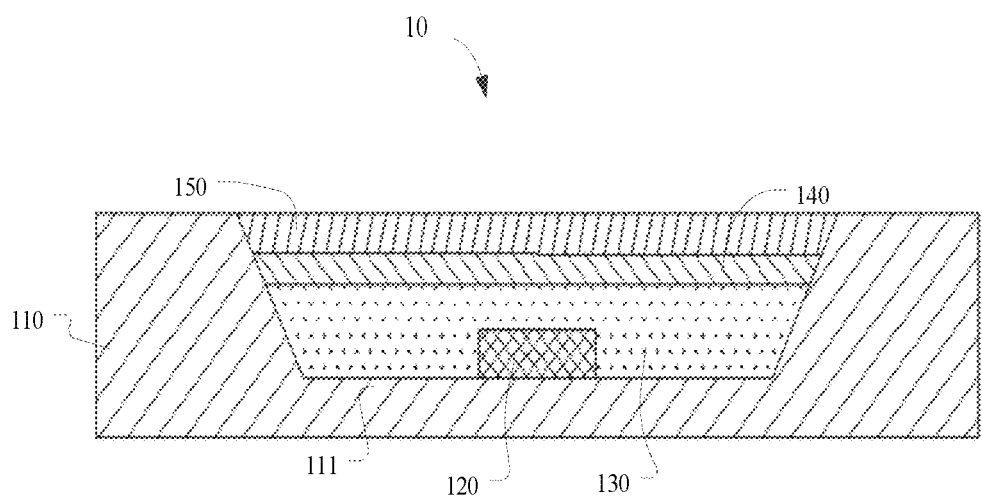
FIG. 1 is a schematic structural view of a quantum dot LED according to some embodiments of the present application.

FIG. 1 is a schematic structural view of a quantum dot LED according to some embodiments of the present application. As shown in FIG. 1, the quantum dot LED 10 includes an LED support 110, an LED chip 120, a filling layer 130, and a quantum dot layer 140, where the LED support 110 comprises a sink-shaped chamber 111; the LED chip 120 is arranged on a bottom surface of the chamber 111, which may be located at a central position of the bottom surface of the chamber 111; the filling layer 130 covers the bottom surface of the chamber and the LED chip 120, and is engaged with walls of the chamber; and the quantum dot layer 140 is arranged at an opening on a top surface of the chamber, a light incident side of the quantum dot layer 140 abuts against a surface of the filling layer 130 away from the bottom surface of the chamber, and a shortest distance h between the LED chip 120 and the quantum dot layer 140 is equal to or greater than 0.03 mm, i.e., h≥0.03 mm (millimeter). In some embodiments, the filling layer 130 being engaged with the walls of the chamber means that the filling layer 130 abuts against sidewalls of the chamber.

In some embodiments, the bottom surface of the chamber 111 may be a flat plate (which is not limited in this application), moreover, the sidewalls of the sink-shaped chamber 111 have characteristics such as high reflectivity in full visible light wavelengths, blue light radiation tolerance and high temperature resistance, and may be materials with high reflectivity while in some embodiments, may be specially treated EMC (Epoxy Molding Compound) or PC (Polycarbonate) materials. The filling layer 130 covers the bottom surface of the entire chamber 111 and all light emitting surfaces of the LED chip 120. An upper surface of the filling layer 130 may be parallel to the bottom surface of the chamber 111, and surroundings thereof is closely engaged with the sidewalls of the chamber 111.

In some embodiments, the LED support 110 may be centrosymmetric, the central axis may be located at the geometric center of the support, and the center of the LED chip 120 may be located on the central axis of the LED support 110. In some embodiments, the LED chip 120 may be a blue LED chip that emits blue light whose wavelength ranges from 400 nm to 480 nm (nanometer).

As discussed above, the quantum dot layer 140 is arranged at an opening on the top surface of the chamber. In some embodiments, the quantum dot layer 140 is provided in the chamber and is close to the opening on the top surface of the chamber. In some embodiments, the quantum dot layer 140 is arranged at an interface between the chamber and the outside. It should be noted that the arrangement of the quantum dot layer is not limited herein. In some embodiments, the quantum dot layer 140 includes a red quantum dot material and a green quantum dot material, where the green quantum dot material may have a wavelength ranging from 520 nm to 550 nm, which may be excited to generate green light having a wavelength ranging from 520 nm to 550 nm, and the red quantum dot material may have a wavelength ranging from 610 nm to 650 nm, which may be excited to generate red light having a wavelength ranging from 610 to 650 nm The blue light emitted from the LED chip 120 excites the quantum dot layer including the red quantum dot material and green quantum dot material to generate a mixed white light. In some embodiments, the red quantum dot material and the green quantum dot material contained in the quantum dot layer may be respectively located in different layers, that is, the quantum dot layer may include a layer of red quantum dot material and a layer of green quantum dot material.

In some embodiments, as shown in FIG. 1, the filling layer 130 includes a colloid layer, that is, the filling layer is composed of the colloid layer. A surface of the colloid layer away from the bottom surface of the chamber abuts against the light incident side of the quantum dot layer 140. The colloid layer is filled with a colloid mixture of fluorescent power and scattering particles.

In some embodiments, the fluorescent power described above is a red fluorescent power, and is made of nitride or KSF (K2SiF6:Mn4+) fluorescent power. Under radiation from the blue light, the red fluorescent power described above may absorb 20% to 40% energy of the blue light and is excited to produce red light, with 60% to 80% energy of the blue light remained.

Figure 2:
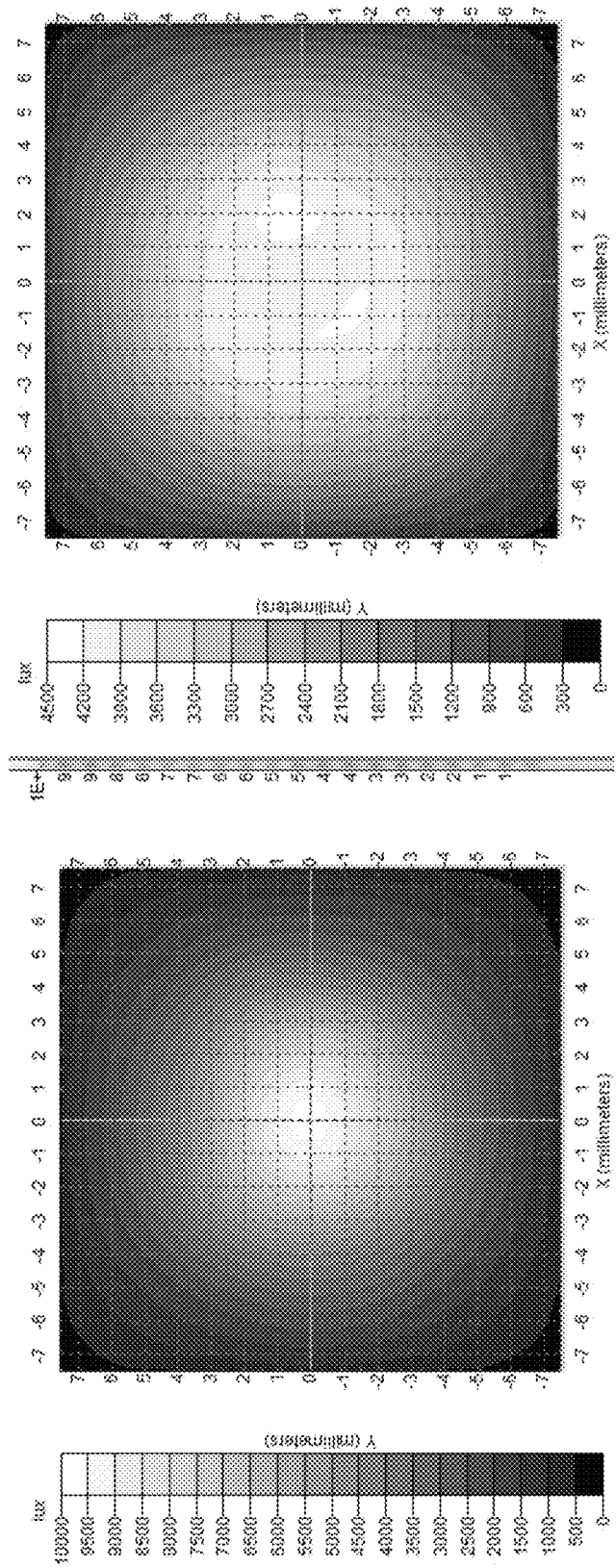
FIG. 2 is a diagram showing optical power distribution of a quantum dot LED according to some embodiments of the present application.

In some embodiments, the scattering particles include at least one of SiO2, CaCO3, TiO2, BaSO4, and glass microbeads. The scattering particles described above can destroy Lambertian distribution of luminous intensity of blue light, so that the blue light can be more uniformly distributed on an entire area of the quantum dot layer 140, instead of being concentrated in an area where the corresponding LED chip 110 has a small light emitting angle on the quantum dot layer 140, and thus the maximum blue light irradiation energy per unit area is reduced by 40% to 60%, resulting in that the maximum blue light irradiation energy per unit area is changed to 40% to 60% of it was. As shown in FIG. 2, FIG. 2 is a diagram showing optical power distribution when a quantum dot layer is irradiated by blue light with scattering particles in the quantum dot LED 10 and without scattering particles in the quantum dot LED 10 according to some embodiments of the present application. The left side of FIG. 2 shows optical power distribution when a quantum dot layer is irradiated by blue light without scattering particles, and the right side shows optical power distribution when a quantum dot layer 140 is irradiated by blue light with scattering particles.

In some embodiments, the LED chip will generate a large amount of heat during the illuminating process, and the quantum dot layer generates a large amount of heat during the excitation process, resulting high temperature. In order to assure normal operation of the quantum dot LED and transmission of the light through the filling layer, a material having good light transmittance and high temperature resistance is desirable for the colloid layer contained in the filling layer. In some embodiments, the colloid in the colloid layer includes materials made of at least one of silica gel and epoxy resin.

If the quantum dot material is exposed to the air for a long time, the quantum dot material in the quantum dot layer will may not work properly due to the action of water and oxygen in the air, which is not beneficial for reliability and service life of the quantum dot LED. Therefore, in some embodiments, in order to increase work life of the quantum dot material in the quantum dot layer, damages from water and oxygen to the quantum dot material are blocked from the top to enhance effectiveness of the quantum dot LED. The quantum dot LED described above further includes a water-oxygen barrier layer 150 attached to a light emitting side of the quantum dot layer 140. The main component of the water-oxygen barrier layer may include at least one of Al2O3 and SiO2, and is arranged on the light emitting side of the quantum dot layer 140 by means of sputtering or evaporating (that is, a side of the quantum dot layer 140 in contact with the air), in order to block damages from water and oxygen in the air to the quantum dot material from the top.

Figure 3:
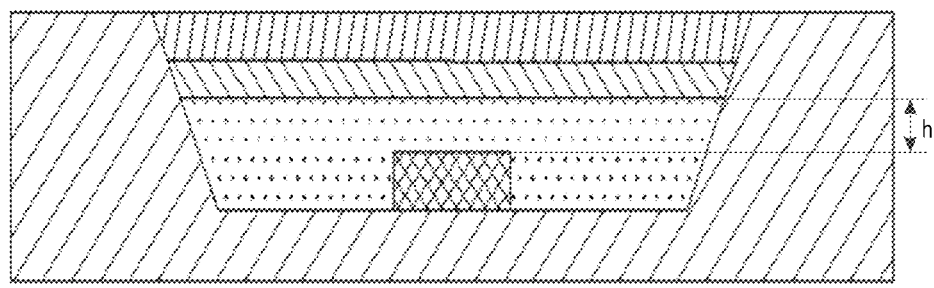
FIG. 3 is a schematic structural view showing a shortest distance between an LED chip and a quantum dot layer in the quantum dot LED shown in FIG. 1.

FIG. 3 is a schematic structural view showing a shortest distance between an LED chip and a quantum dot layer in the quantum dot LED shown in FIG. 1. As shown in FIG. 3, the shortest distance between the LED chip 120 and the quantum dot layer 140 is h.

In some embodiments, according to Lambertian distribution of the LED chip, per different distances, the relationship between the maximum blue luminous intensity per unit area of a common blue LED and the distance x from the LED chip thereto may be determined using the following:

$$y = a \times (0.0338x^4 - 0.5712x^3 + 3.6895x^2 - 11.213x + 14.77)$$

where y is blue light energy received by the quantum dot material per unit area from the LED chip (unit: watt/square centimeter, W/cm2) and, $a = P_e/0.55$, a is a conversion rate of the light energy of the filling layer 150. In some embodiments, $0.24 \leq a \leq 0.48$, and Pe is optical power of the selected LED chip.

In some embodiments, assuming that the maximum optical power of blue light per unit area that is tolerable for the quantum dot layer 140 is 5 W/cm2 and the shortest distance from the LED chip to the quantum dot layer is h, the optical power Pe of the blue light emitted from the quantum dot LED chip and the shortest distance h from the LED chip to the quantum dot layer can be determined using the following:

$$a \times (0.0338h^4 - 0.5712h^3 + 3.6895h^2 - 11.213h + 14.77) \leq 5$$

that is:

$$P_e \times (0.0338h^4 - 0.5712h^3 + 3.6895h^2 - 11.213h + 14.77) \leq 2.75$$

where $P_e$ is generally in a range of: 0.62 W to 4.23 W, while the optical power $P_e$ of the commonly used LED chip is in a range of 0.05 W to 1.8 W. In general, the thinner the thickness of the LED, the higher the light emission efficiency, thus the shortest distance that meets reliability is taken and, correspondingly, h has a value range of: $h \geq 0.03$ mm. It should be noted that the overall thickness of the display device will be increased when the distance h is too large, moreover, there will be insufficient luminous intensity when the LED chip 110 has a large light emitting angle, which is of no practical significance, and therefore, h is generally less than 2.5 mm.

In some embodiments, if a calculation is performed based on the assumption that the maximum optical power of the blue light per unit area that is tolerable for the quantum dot layer is below 2 W/cm2 for recommended use, the optical power $P_e$ of the LED chip and the distance h from the LED chip to the quantum dot layer satisfy the following relationship:

$$P_e \times (0.0338h^4 - 0.5712h^3 + 3.6895h^2 - 11.213h + 14.77) \leq 1.1$$

In this situation, the optical power $P_e$ of the LED chip 110 ranges from 0.17 W to 1.69 W, and the minimum value thereof is also reduced, compared to the optical power of a commonly used LED chip ranging from 0.05 W to 1.8 W.

In some embodiments, according to Lambertian distribution of the LED chip, for different distances, the relationship between the maximum blue luminous intensity of a common blue LED per unit area and the distance x from the LED chip thereto may also be determined using the following formula:

$$y = (P_e/0.55) \times (-0.0001x^6 + 0.0018x^5 - 0.0107x^4 + 0.0277x^3 - 0.0136x^2 - 0.0776x + 0.1399)$$

where y is blue light energy received by the quantum material per unit area from the LED chip (unit: watt/square centimeter, W/cm²), and $P_e$ is optical power of the selected LED chip.

In some embodiments, under the assumption that the maximum optical power of blue light per unit area that is tolerable for the quantum dot layer 140 is 5 W/cm2 and the shortest distance from the LED chip to the quantum dot layer is h, the optical power $P_e$ of the blue light emitted from the quantum dot LED chip and the shortest distance h from the LED chip to the quantum dot layer may be determined using the following formula:

$$a \times P_e(-0.0001h^6 + 0.0018h^5 - 0.0107h^4 + 0.0277h^3 - 0.0136h^2 - 0.0776h + 0.1399) \leq 2.75 \times 10^{-2}$$

where a is a conversion rate of the light energy of the filling layer 150, and in some embodiments, $0.24 \leq a \leq 0.48$ (which has been discussed above), $P_e$ is generally in a range of: 0.62 W~4.23 W, while the optical power $P_e$ of the commonly used LED chip is in a range of 0.05 W~1.8 W. In general, the thinner the thickness of the LED, the higher the light emission efficiency, thus the shortest distance that meets reliability is taken and, correspondingly, h has a value range of: $h \geq 0.03$ mm. It should be noted that the overall thickness of the display device will be increased if the distance h is too long, moreover, there will be insufficient luminous intensity when the LED chip 110 has a large light emitting angle, which is of no practical significance, therefore, h is generally less than 2.5 mm.

In some embodiments, under the assumption that the maximum optical power of the blue light per unit area that is tolerable for the quantum dot layer is below 2 W/cm2 according to recommended use, the optical power $P_e$ of the LED chip and the distance h from the LED chip to the quantum dot layer satisfy the following formula:

$$P_e \times (-0.0001h^6 + 0.0018h^5 - 0.0107h^4 + 0.0277h^3 - 0.0136h^2 - 0.0776h + 0.1399) \leq 1.1 \times 10^{-2}$$

In this situation, the optical power $P_e$ of the LED chip 110 ranges from 0.17 W to 1.69 W, and the minimum value thereof is also reduced compared to the optical power of a commonly used LED chip ranging from 0.05 W to 1.8 W.

In the related art, the quantum dot material has a tolerable power limit of 5 W/cm2 for the blue light, but the luminous intensity distribution of the LED chip presents Lambertian distribution, the smaller the light emitting angle, the higher the optical power per unit area. The quantum dot material right above the LED chip is more susceptible to irradiation of high intensity; such distance will allow quantum dots to be irradiated by blue light having optical power up to 60

W/cm2~100 W/cm2, which easily causes the quantum dots right above the LED chip to fail to function properly.

According to the embodiments of the present application, the minimum distance at the center of the filling layer (that is, the shortest distance between the LED chip and the quantum dot layer) is selected to be 0.03 mm, taking it into the above formula in some embodiments, thus, the maximum optical power of blue light that the quantum dot material receives is 0.2 W, which is less than the optical power limit of the blue light that is tolerable for the quantum dot material, which will not cause the quantum dot material fail to work.

The quantum dot LED provided in the embodiments of the present application allows for providing a filling layer including a colloid layer between a quantum dot layer and an LED chip to prevent a quantum dot material from directly contacting the LED chip, and allows for the LED chip being separated from the quantum dot layer by a certain distance h that meets h≥0.03 mm to reduce the maximum optical power of blue light that the quantum dot material right above the LED chip receives, causing the maximum optical power received fall within an optical power limit of blue light of the quantum dot material, which contributes to reduce function loss of the quantum dot area right above the LED chip, extend the life of the LED chip, improve the reliability of the quantum dot LED, and allow for high gamut display of the quantum dot LED as well.

Figure 4:
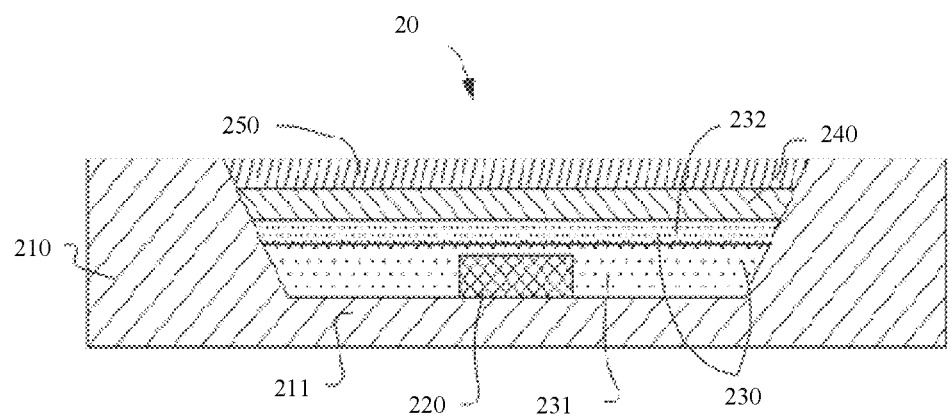
FIG. 4 is a schematic structural diagram of a quantum dot LED according to some embodiments of the present application.

FIG. 4 is a schematic structural diagram of a quantum dot LED according to some embodiments of the present application. As shown in FIG. 4, similar to the quantum dot LED shown in FIG. 1, the quantum dot LED 20 includes an LED support 210, an LED chip 220, a filling layer 230, and a quantum dot layer 240, where the LED support 210 comprises a sink-shaped chamber 211; the LED chip 220 is arranged on a bottom surface of the chamber 211; the filling layer 230 covers the bottom surface of the chamber and the LED chip 220, and is engaged with walls of the chamber; and the quantum dot layer 240 is arranged at an opening on a top surface of the chamber, a light incident side of the quantum dot layer 240 abuts against a surface of the filling layer 230 away from the bottom surface of the chamber, and a shortest distance h between the LED chip 220 and the quantum dot layer 240 meets h≥0.03 mm. The difference from the quantum dot LED shown in FIG. 1 lies in the following aspects.

The filling layer 230 includes a colloid layer 231 and a scattering layer 232, that is, the filling layer 230 comprises the colloid layer 231 and the scattering layer 232, the scattering layer 232 is located between the colloid layer 231 and the quantum dot layer 240, where one side of the scattering layer 232 abuts a side of the colloid layer 231 away from the bottom surface of the chamber 211, and the other side of the scattering layer 232 abuts against the light incident side of the quantum dot layer 240. The colloid layer is filled with a colloid mixture with a fluorescent power, and the scattering layer is composed of scattering particles. The fluorescent power is a red fluorescent power, and is made of nitride or a KSF materials. The colloid includes at least one of epoxy resin and silica gel. The scattering particles include at least one of SiO2, CaCO3, TiO2, BaSO4, and glass microbeads.

Since the quantum dot LED described in this embodiment is similar to the quantum dot LED described in the embodiment shown in FIG. 1, reference may be made to the description associated with the quantum dot LED shown in FIG. 1, and details will be omitted.

Figure 5:
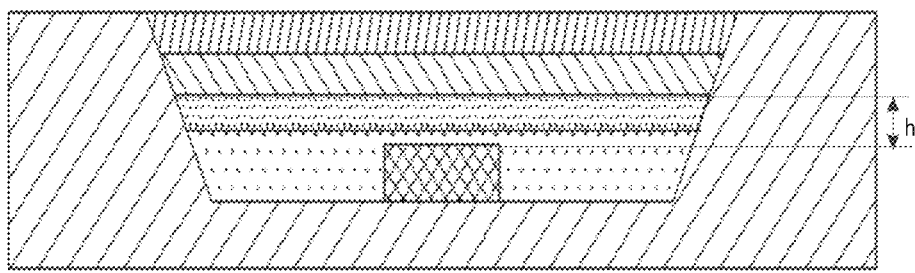
FIG. 5 is a schematic structural view showing a shortest distance between an LED chip and a quantum dot layer in the quantum dot LED shown in FIG. 4.

FIG. 5 is a schematic structural view showing a shortest distance between an LED chip and a quantum dot layer in the quantum dot LED shown in FIG. 4. The filling layer 230 including the colloid layer 231 and the scattering layer 232 is provided between the quantum dot layer 240 and the LED chip 220 to separate them at a certain distance h.

For details, reference may be made to related description with respect to FIG. 3, and details will not be described herein again. In general, the thinner the thickness of the LED, the higher the light emitting efficiency. Therefore, a minimum distance that meets reliability is taken and, correspondingly, h generally has a value range of: h≥0.03 mm. h is selected to be 0.03 mm, taking it into the above formula, in this scenario, the maximum optical power of blue light received by the quantum dot material is 0.2 W, which is less than the optical power limit of the blue light that is tolerable for the quantum dot material, ensuring reliability of the quantum dot LED.

The quantum dot LED provided in the embodiments of the present application provides a filling layer including a colloid layer and a scattering layer between a quantum dot layer and an LED chip to prevent direct contact between a quantum dot material and the LED chip, and allows for the LED chip being separated from the quantum dot layer by a certain distance h that meets h≥0.03 mm to reduce the maximum optical power of blue light received by the quantum dot material right above the LED chip, causing the maximum optical power received fall within the an optical power limit of the quantum dot material, which helps to decrease the function loss of the quantum dot area right above the LED chip and make the service life of the quantum dot LED longer.

Figure 6:
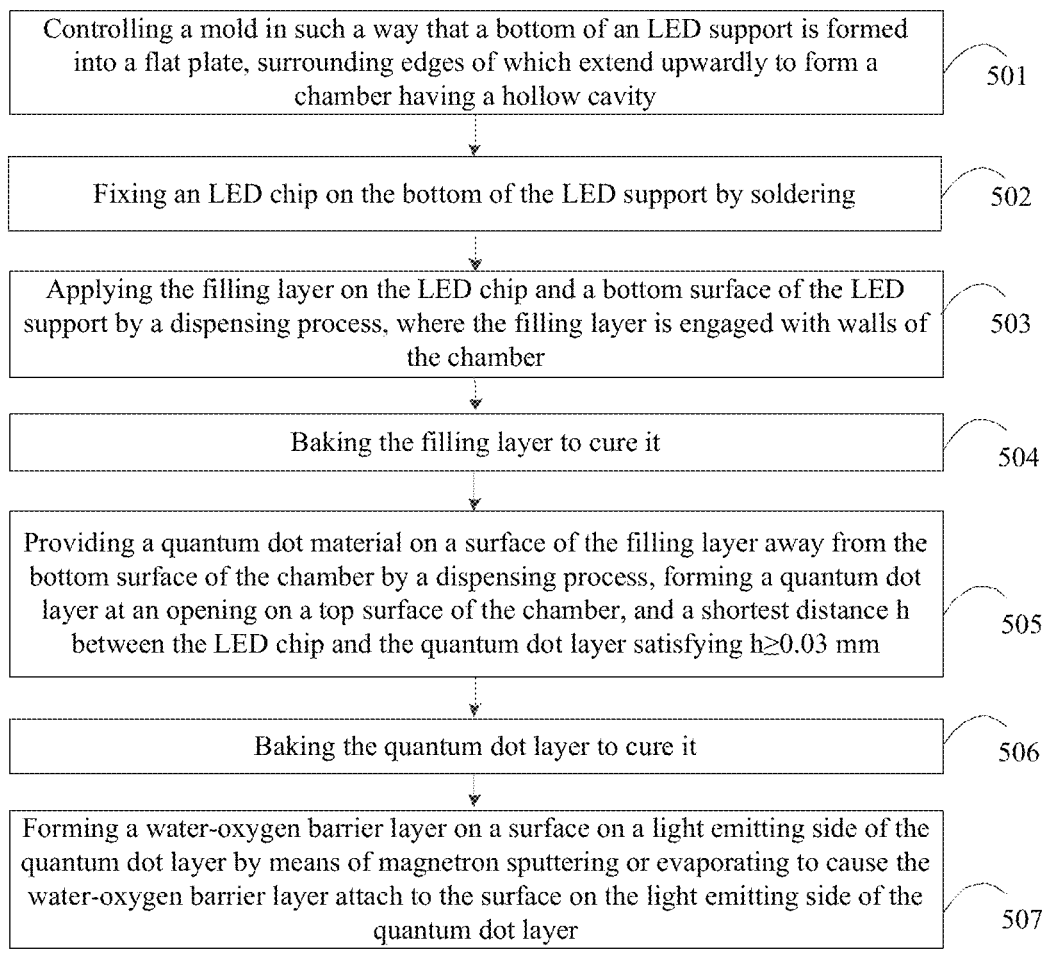
FIG. 6 is a flow chart of a manufacturing method of a quantum dot LED according to some embodiments of the present application.

FIG. 6 is a flow chart of a manufacturing method of a quantum dot LED according to some embodiments of the present application. As shown in FIG. 6, the manufacturing method of the quantum dot LED includes the following steps:

S501, controlling a mold in such a way that a bottom of an LED support is formed into a flat plate, surrounding edges of which extend upwardly to form a chamber having a hollow cavity;

S502, fixing an LED chip on the bottom of the LED support by soldering;

S503, applying the filling layer on the LED chip and a bottom surface of the LED support by a dispensing process, where the filling layer is engaged with walls of the chamber;

S504, baking the filling layer to cure it;

S505, providing a quantum dot material on a surface of the filling layer away from the bottom surface of the chamber by a dispensing process, forming a quantum dot layer at an opening on a top surface of the chamber, and a shortest distance h between the LED chip and the quantum dot layer satisfying h≥0.03 mm; and S506, baking the quantum dot layer to cure it.

In some embodiments, the filling layer, as shown in FIG. 1, comprises a colloid layer, and Step S503 includes:

applying the colloid layer on the LED chip and a bottom surface of the LED support by a dispensing process, where the colloid layer includes a colloid mixture of fluorescent power and scattering particles.

The colloid layer is filled with a colloid mixture of fluorescent power and scattering particles. The fluorescent power is a red fluorescent power, and is made of nitride or a KSF materials. The scattering particles include at least one of SiO2, CaCO3, TiO2, BaSO4, and glass microbeads. Since the quantum dot layer generates a large amount of heat during the excitation process, the temperature is high, and thus a material having good light transmittance and high temperature resistance is desirable for the filling layer. In some embodiments, the colloid in the colloid layer comprises materials such as at least one of epoxy resin and silica gel.

In some embodiments, the filling layer, as shown in FIG. 4, comprises a colloid layer and a scattering layer, and Step S503 includes:

applying the colloid layer on the LED chip and a bottom surface of the LED support by a dispensing process, where the colloid layer includes a colloid mixture of a fluorescent power; and applying the scattering layer on the colloid layer by a dispensing process, where the scattering layer includes scattering particles.

The colloid layer is filled with a colloid mixture of fluorescent power, and the scattering layer is composed of scattering particles. The fluorescent power is a red fluorescent power, and is made of nitride or a KSF phosphor. The colloid includes materials such as at least one of epoxy resin and silica gel. The scattering particles include particles such as at least one of SiO2, CaCO3, TiO2, BaSO4, and glass microbeads.

In some embodiments, the above manufacturing method may further include the following step:

S507, forming a water-oxygen barrier layer on a surface on a light emitting side of the quantum dot layer by means of magnetron sputtering or evaporating to cause the water-oxygen barrier layer attach to the surface on the light emitting side of the quantum dot layer.

In some embodiments, in Step S501, an EMC or PC material with blue light radiation tolerance, high temperature resistance, and high reflectivity in full visible wavelengths may be used to form the bottom of the support into a flat plate, surrounding edges of which extend upwardly to form a sink-shaped chamber; the bottom of the support may be integrally formed with the surrounding edges; in Step S502, the LED chip is fixed on the bottom of the LED support, for example, by soldering, where the center of the LED chip may be located on the central axis of the LED support; in Step S503, a filling layer may be formed by applying an epoxy resin mixture of fluorescent power and scattering particles or a silica gel mixture of fluorescent power and scattering particles on the LED chip and the bottom of the support by a dispensing process, or a colloid layer may be formed by applying silica gel or epoxy resin mixed with a fluorescent power on the LED chip and the bottom of the support, and then a scattering layer provided with scattering particles is formed on the colloid layer by a dispensing process so that a filling layer including the colloid layer and the scattering layer is formed; and in Step S504, the filling layer is baked to make it.

In some embodiments, in Step S507, a water-oxygen barrier layer is attached to a light emitting side of the quantum dot layer by means of sputtering or evaporating, and damages from water and oxygen to the quantum dot material are blocked from the top. The water-oxygen barrier layer includes a main component made of at least one of Al2O3 and SiO2.

It should be noted that reference may be made to a manufacturing process in the related art for specific manufacturing steps in the embodiment of the present application, such as soldering, dispensing, baking and the like, for which details will not be described herein again.

Some embodiments of the present application further provide a display device including a quantum dot LED that includes an LED support, an LED chip, a filling layer, and a quantum dot layer, where the LED support comprises a sink-shaped chamber; the LED chip is arranged on a bottom surface of the chamber; the filling layer covers the bottom surface of the chamber and the LED chip, and is engaged with walls of the chamber; and the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets h≥0.03 mm.

In some embodiments, the filling layer described above may include a colloid layer (as shown in FIG. 1), that is, the filling layer comprises the colloid layer, and a surface of the colloid layer away from the bottom surface of the chamber abuts against the light incident side of the quantum dot layer. The colloid layer is filled with a colloid mixture of fluorescent power and scattering particles. The fluorescent power is red fluorescent power, and is made of nitride or KSF fluorescent power. The scattering particles include at least one of SiO2, CaCO3, TiO2, BaSO4, and glass microbeads. Since the quantum dot layer generates a large amount of heat during the excitation process, the temperature is high, and thus a material having good light transmittance and high temperature resistance is selected for the filling layer. In some embodiments, the colloid in the colloid layer includes materials such as at least one of epoxy resin and silica gel.

In some embodiments, in order to increase service life of red and green quantum dots in the quantum dot layer, damages from water and oxygen to the quantum dot material are blocked from the top to enhance performance of the quantum dot LED. The quantum dot LED described above further includes a water-oxygen barrier layer attached to a light exiting side of the quantum dot layer. The water-oxygen barrier layer includes a component made of at least one of Al2O3 and SiO2.

In some embodiments, the filling layer described above may include a colloid layer and a scattering layer (as shown in FIG. 4), that is, the filling layer is composed of the colloid layer and the scattering layer, and the scattering layer is located between the colloid layer and the quantum dot layer, where one side of the scattering layer abuts a side of the colloid layer away from the bottom surface of the chamber, and the other side of the scattering layer abuts against the light incident side of the quantum dot layer. The colloid layer is filled with a colloid mixture of fluorescent power, and the scattering layer is composed of scattering particles. The fluorescent power is a red fluorescent power, and is made of nitride or KSF fluorescent power. The colloid includes materials such as at least one of epoxy resin and silica gel. The scattering particles include at least one of SiO2, CaCO3, TiO2, BaSO4, and glass microbeads.

The quantum dot LED in the display device may be the quantum dot LED shown in FIG. 1 or FIG. 4, which has similar structures and technical effects. Reference may be made to related description of the quantum dot LED shown in FIG. 1 or FIG. 4 described above for details, which will be omitted herein.

The above description is only intended for helping those skilled in the art to understand the technical solutions of the present application, and is not intended to limit the present application. For those of ordinary skill in the art, any modifications, equivalent substitutions, and improvements made without departing from principles of the present application shall fall within the scope of the present application.

What is claimed is:

1. A quantum dot light-emitting diode (LED), comprising an LED support, an LED chip, a filling layer, and a quantum dot layer, wherein:
the LED support comprises a chamber;
the LED chip is arranged on a bottom surface of the chamber;
the filling layer covers the bottom surface of the chamber and the LED chip, and is engaged with walls of the chamber; and
the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets h≥0.03 mm is determined by:

$$Pe \times (0.0338h^4 - 0.5712h^3 + 3.6895h^2 - 11.213h + 14.77) \leq 2.75$$

wherein Pe is an optical power of a blue light emitted from the quantum dot LED chip and is in a range of: 0.62 W to 4.23 W;
wherein the filling layer comprises a colloid layer and a scattering layer, wherein the colloid layer is filled with a colloid mixture of fluorescent power, the scattering layer is composed of scattering particles, one side of the scattering layer abuts against the colloid layer, and the other side of the scattering layer abuts against the light incident side of the quantum dot layer.

2. The quantum dot LED according to claim 1, wherein the fluorescent power is red fluorescent power, and is made of nitride or KSF material.

3. The quantum dot LED according to claim 1, wherein the colloid comprises at least one of epoxy resin and silica gel.

4. The quantum dot LED according to claim 1, wherein the scattering particles comprise at least one of SiO2, CaCO3, TiO2, BaSO4, and glass microbeads.

5. The quantum dot LED according to claim 1, further comprising a water-oxygen barrier layer attached to a light emitting side of the quantum dot layer.

6. The quantum dot LED according to claim 5, wherein the water-oxygen barrier layer comprises a component made of at least one of Al2O3 and SiO2.

7. The quantum dot LED according to claim 1, wherein the quantum dot layer contains a red quantum dot material and a green quantum dot material.

8. The quantum dot LED according to claim 7, wherein the red quantum dot material and the green quantum dot material contained in the quantum dot layer are respectively located in different layers.

9. A display device, comprising a quantum dot light-emitting diode (LED) that comprises an LED support, an LED chip, a filling layer, and a quantum dot layer, wherein:
the LED support comprises a chamber;
the LED chip is arranged on a bottom surface of the chamber;
the filling layer covers the bottom surface of the chamber and the LED chip, and is engaged with walls of the chamber; and
the quantum dot layer is arranged at an opening on a top surface of the chamber, a light incident side of the quantum dot layer abuts against a surface of the filling layer away from the bottom surface of the chamber, and a shortest distance h between the LED chip and the quantum dot layer meets h≥0.03 mm is determined by:

$$Pe \times (0.0338h^4 - 0.5712h^3 + 3.6895h^2 - 11.213h + 14.77) \leq 2.75$$

wherein Pe is an optical power of a blue light emitted from the quantum dot LED chip and is in a range of: 0.62 W to 4.23 W;
wherein the filling layer comprises a colloid layer and a scattering layer, wherein the colloid layer is filled with a colloid mixture of fluorescent power, the scattering layer is composed of scattering particles, one side of the scattering layer abuts against the colloid layer, and the other side of the scattering layer abuts against the light incident side of the quantum dot layer.

10. The display device according to claim 9, wherein the fluorescent power is red fluorescent power, and is made of nitride or KSF material.

11. The display device according to claim 9, wherein the colloid comprises at least one of epoxy resin and silica gel.

12. The display device according to claim 9, wherein the scattering particles comprise at least one of SiO2, CaCO3, TiO2, BaSO4, and glass microbeads.

13. The display device according to claim 9, wherein the quantum dot LED further comprises a water-oxygen barrier layer attached to a light emitting side of the quantum dot layer.

14. The display device according to claim 13, wherein the water-oxygen barrier layer comprises a component made of at least one of Al2O3 and SiO2.

15. The display device according to claim 9, wherein the quantum dot layer contains a red quantum dot material and a green quantum dot material.

* * * * *